(12) United States Patent
Ushijima et al.

(10) Patent No.: US 9,437,562 B2
(45) Date of Patent: Sep. 6, 2016

(54) SEMICONDUCTOR DEVICE AND MANUFACTURING METHOD OF SEMICONDUCTOR DEVICE

(71) Applicant: TOYOTA JIDOSHA KABUSHIKI KAISHA, Toyota-shi, Aishi-ken (JP)

(72) Inventors: Takashi Ushijima, Nagoya (JP); Atsushi Imai, Toyota (JP); Jiro Nohara, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/469,056

(22) Filed: Aug. 26, 2014

(65) Prior Publication Data

US 2015/0061122 A1  Mar. 5, 2015

(30) Foreign Application Priority Data

Sep. 3, 2013  (JP) ................. 2013-182439

(51) Int. Cl.
*H01L 21/02* (2006.01)
*H01L 23/00* (2006.01)
*H01L 23/31* (2006.01)

(52) U.S. Cl.
CPC ............ *H01L 24/11* (2013.01); *H01L 23/3171* (2013.01); *H01L 24/03* (2013.01); *H01L 24/05* (2013.01); *H01L 24/16* (2013.01); *H01L 24/81* (2013.01); *H01L 2224/0345* (2013.01); *H01L 2224/0346* (2013.01); *H01L 2224/03332* (2013.01); *H01L 2224/03472* (2013.01); *H01L 2224/0401* (2013.01); *H01L 2224/04026* (2013.01); *H01L 2224/05553* (2013.01); *H01L 2224/05554* (2013.01); *H01L 2224/05557* (2013.01); *H01L 2224/05558* (2013.01); *H01L 2224/05559* (2013.01); *H01L 2224/05571* (2013.01); *H01L 2224/10145* (2013.01); *H01L 2224/11472* (2013.01); *H01L 2224/131* (2013.01); *H01L 2224/16013* (2013.01);
(Continued)

(58) Field of Classification Search
CPC .................. H01L 21/02631; H01L 21/02697
See application file for complete search history.

(56) References Cited

U.S. PATENT DOCUMENTS

2010/0258524 A1\* 10/2010 Remiat et al. .................. 216/12

FOREIGN PATENT DOCUMENTS

JP  46-034941 Y  12/1971
JP  S52-64285 A  5/1977
(Continued)

OTHER PUBLICATIONS

Partial translation of Aug. 25, 2015 Office Action issued in Japanese Application No. 2013-182439.

*Primary Examiner* — Jae Lee
(74) *Attorney, Agent, or Firm* — Oliff PLC

(57) ABSTRACT

A manufacturing method of a semiconductor device includes placing a mask having an opening on an external region of a top face of a substrate to locate an end portion of the opening of the mask just above a concave portion formed on the top face of the substrate, the external region being located outside the concave portion. The manufacturing method further includes: growing a conductive film on part of the top face of the substrate through the mask after the mask is placed on the substrate, the part of the top face containing the concave portion; and removing the mask from the substrate after the conductive film is grown.

4 Claims, 9 Drawing Sheets

(52) U.S. Cl.
CPC ............ *H01L 2224/16054* (2013.01); *H01L 2224/16058* (2013.01); *H01L 2224/16059* (2013.01); *H01L2224/16111* (2013.01); *H01L 2224/16227* (2013.01); *H01L 2224/81801* (2013.01); *H01L 2924/351* (2013.01); *H01L 2924/35121* (2013.01); *H01L 2924/37001* (2013.01)

(56) References Cited

FOREIGN PATENT DOCUMENTS

| | | |
|---|---|---|
| JP | A-2002-38254 | 2/2002 |
| JP | B2-3864232 | 12/2006 |

\* cited by examiner

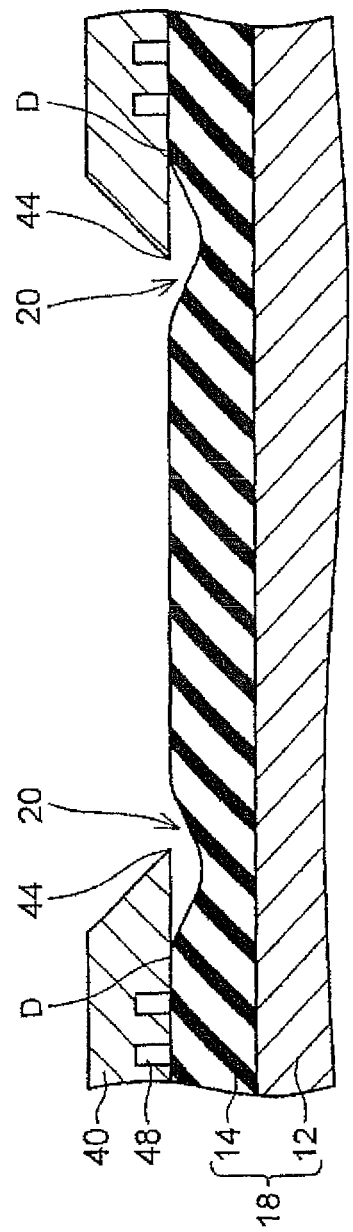

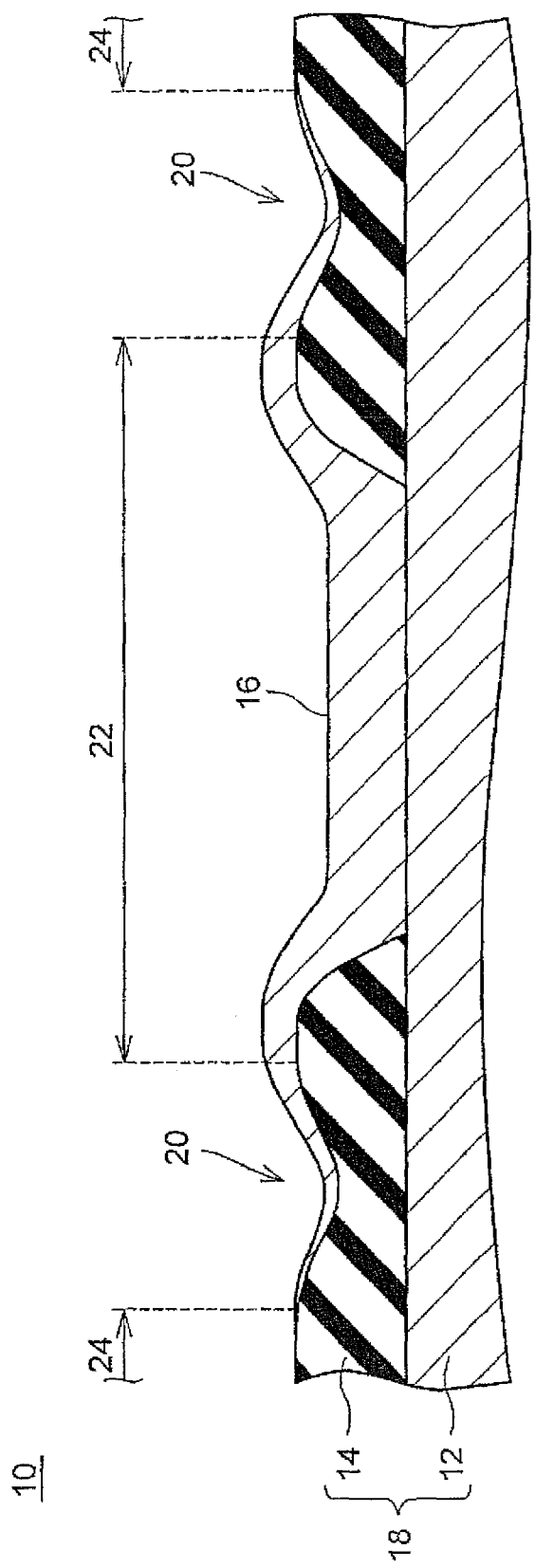

SEMICONDUCTOR DEVICE AND MANUFACTURING METHOD OF SEMICONDUCTOR DEVICE

INCORPORATION BY REFERENCE

The disclosure of Japanese Patent Application No. 2013482439 filed on Sep. 3, 2013 including the specification, drawings and abstract is incorporated herein by reference in its entirety.

BACKGROUND OF THE INVENTION

1. Field of the Invention

The present invention relates to a semiconductor device and a manufacturing method of the semiconductor device.

2. Description of Related Art

Japanese Patent Application Publication No. 2002-38254 (JP 2002-38254 A) has disclosed a technology of placing a mask on the top face of a substrate containing an opening and growing a conductive film on the top face of the substrate through the mask. As a result, a patterned conductive film can be formed on the top face of the substrate.

When manufacturing a mask disclosed in the JP 2002-38254 A, a manufacturing error occurs in the size of its opening portion. Further, when placing the mask on the top face of a substrate as described in the JP 2002-38254 A, an error occurs in its placing position. Due to influences of these errors, it is difficult to form the conductive film at a high precision according to the technology of the JP 2002-38254 A.

SUMMARY OF THE INVENTION

The present invention provides a semiconductor device in which a conductive film can be formed at a higher precision and a manufacturing method of the semiconductor device.

A manufacturing method of a semiconductor device according to a first aspect of the present invention includes placing a mask having an opening on an external region of a top face of a substrate to locate an end portion of the opening of the mask just above a concave portion formed on the top face of the substrate, the external region being located outside the concave portion. The manufacturing method further includes: growing a conductive film on part of the top face of the substrate through the mask after the mask is placed on the substrate, the part of the top face containing the concave portion; and removing the mask from the substrate after the conductive film is grown.

With such a structure, when the conductive film is grown, no conductive film is formed in a region covered with the mask of the top face of the substrate. Further, the conductive film is formed in the region in which the opening of the mask is located of the top face of the substrate. Because the end portion of the opening of the mask is located above the concave portion, the mask partly exists above the concave portion. Further, the conductive film is also formed inside the concave portion below the mask. Thus, on the top face of the substrate, the conductive film is formed in the region corresponding to the opening of the mask and inside the concave portion located below the end face of the opening of the mask. Thus, the position of the outer peripheral end of the formed conductive film substantially coincides with the position of the outer peripheral end of the concave portion. Because, with such a structure, a formation area of the conductive film is determined by the position of the outer peripheral end of the concave portion, even if an error occurs in the position of the end portion of the opening of the mask, the error does not affect the formation area of the conductive film. Further, the concave portion on the top face of the substrate can be formed at a high precision. Thus, according to this method, the conductive film can be formed on the substrate at a high precision.

In the first aspect of the present invention, the manufacturing method may further include bringing a flat region formed on a lower face of the mask into contact with the external region when the mask is placed on the substrate.

With such a structure, even if the placing position of the mask deviates, the contact position between the mask and the external region does not change. Thus, the conductive film can be formed at a high precision.

In the first aspect of the present invention, the manufacturing method may further include brazing the conductive film to an external terminal after the mask is removed from the substrate.

With such a structure, stress applied from brazing metal to the conductive film can be reduced.

In the first aspect of the present invention, the concave portion may be a groove continuously surrounding an internal region of the top face of the substrate, the internal region being located inside the concave portion.

A semiconductor device according to a second aspect of the present invention includes a substrate in which a concave portion is formed on a top face of the substrate; and a conductive film which is formed at least inside the concave portion. An end portion of the conductive film extends along an end portion of the concave portion.

The semiconductor device with such a structure can be manufactured according to any one of the above-described methods. Thus, the semiconductor device can have conductive film which is patterned at a high precision.

In the second aspect of the present invention, a thickness of the conductive film may increase with distance from the end portion of the conductive film.

In the second aspect of the present invention, the semiconductor device may further include brazing metal which is connected to the conductive film.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 16 is a longitudinal sectional view of a semiconductor device according to a fourth modification of the first embodiment of the present invention; and FIG. 17 is a longitudinal sectional view of a semiconductor device 10 of a first embodiment of the present invention.

DETAILED DESCRIPTION OF EMBODIMENTS

First, characteristics of an embodiment of the present invention will be described below. In the meantime, all the characteristics described here are independently effective.

Hereinafter, a first characteristic of a first embodiment of the present invention will be described. A groove is formed on the top face of a substrate. In step for placing a mask on a substrate, the mask is placed so that a region on one side adjacent to the groove is covered with the mask while an opening of the mask is located on a region on the other side adjacent to the groove. At this time, an end portion of the opening of the mask is located above the groove. A space exists between the groove and the mask.

Hereinafter, a second characteristic of the first embodiment will be described. If a manufacturing error of the opening width of the mask in the width direction of the groove is expressed with symbol "a" and an error in mounting position of the mask is expressed with symbol "b", the width of the groove is a+2b or more.

Hereinafter, the first characteristic of the second embodiment of the present invention will be described. A concave portion is formed on the top face of the substrate. In step of placing the mask on the substrate, a region adjacent to the concave portion is covered with the mask and the mask is placed such that the opening of the mask is located above the concave portion. At this time, an end portion of the opening of the mask is located above the concave portion. A space exists between the concave portion and the mask.

Figure 1:
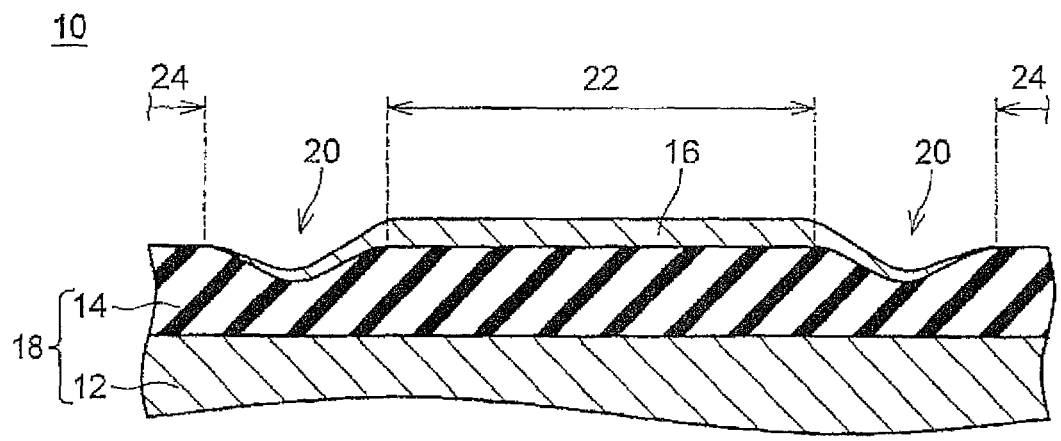
FIG. 1 is a longitudinal sectional view of a semiconductor device 10 of a first embodiment of the present invention.

Each of FIGS. 1 and 17 is a longitudinal sectional view of a semiconductor device 10 of a first embodiment of the present invention. A portion where a surface electrode and a conductive film 16 are connected to each other above a semiconductor substrate 12 is not shown in FIG. 1, but shown in FIG. 17. The surface electrode is formed between the conductive film 16 and the semiconductor substrate 12. In a description below, the surface electrode is called an electrode. In the meantime, the embodiment disclosed in the specification relates to the electrode of the semiconductor device. Thus, a following description is concentrated on points relating to the electrode and description of the internal structure and the like of a semiconductor layer is omitted.

Figure 2:
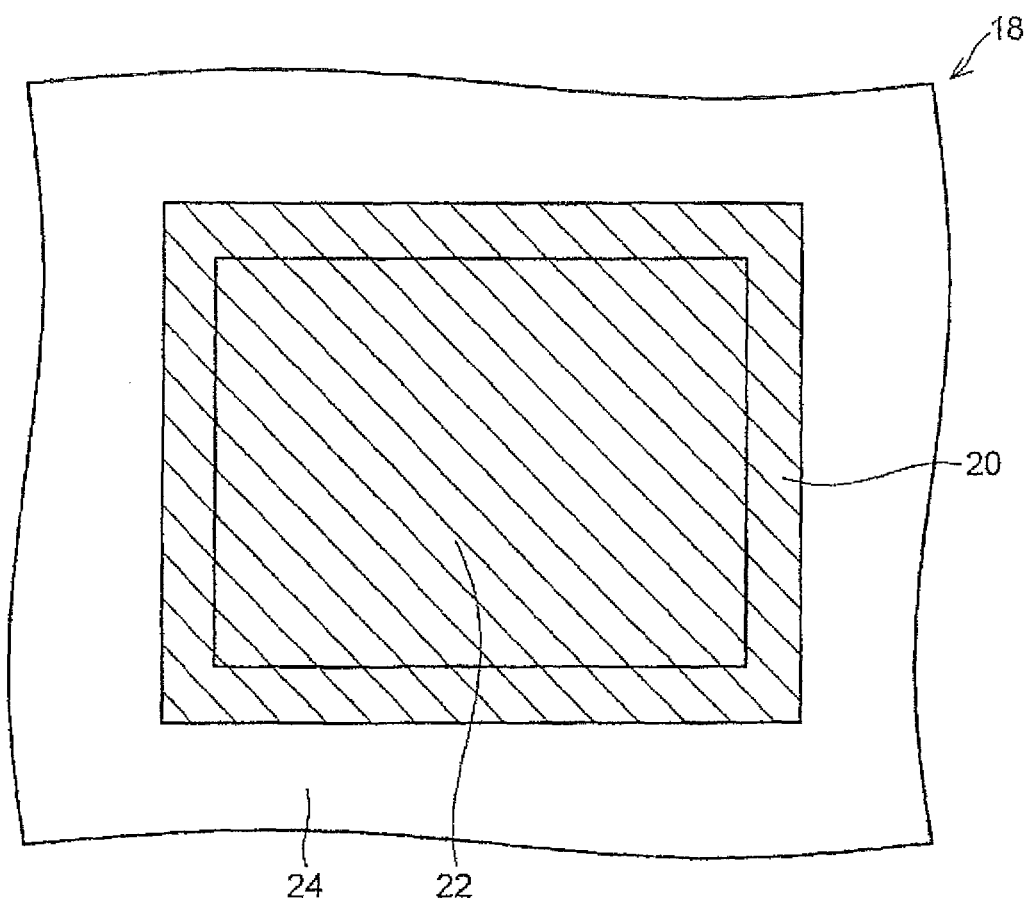
FIG. 2 is a top view of the semiconductor device 10.

The semiconductor device 10 includes the semiconductor substrate 12, an insulation film 14 and the conductive film 16. The insulation film 14 is formed on the semiconductor substrate 12. In a description below, a combination of the semiconductor substrate 12 and the insulation film 14 is called substrate 18. A groove 20 is formed on the top face of the insulation film 14. As shown in FIG. 2, the groove 20 is formed such that it makes a circuit when the substrate 18 is viewed from above. In a description below, when the substrate 18 is viewed from above, a region surrounded by the groove 20 is called internal region 22 and a region, on the outer, peripheral side of the groove 20 is called external region 24. The top face of the insulation film 14 within the internal region 22 and the external region 24 is flat. The conductive film 16 is formed on the insulation film 14. An oblique hatching in FIG. 2 indicates a region in which the conductive film 16 is formed. The conductive film 16 is formed within the internal region 22 and the groove 20. No conductive film 16 is formed within the external region 24. Thus, the outer peripheral end of the conductive film 16 extends along a border between the groove 20 and the external region 24 (i.e., an end portion of the groove 20).

Figure 3:
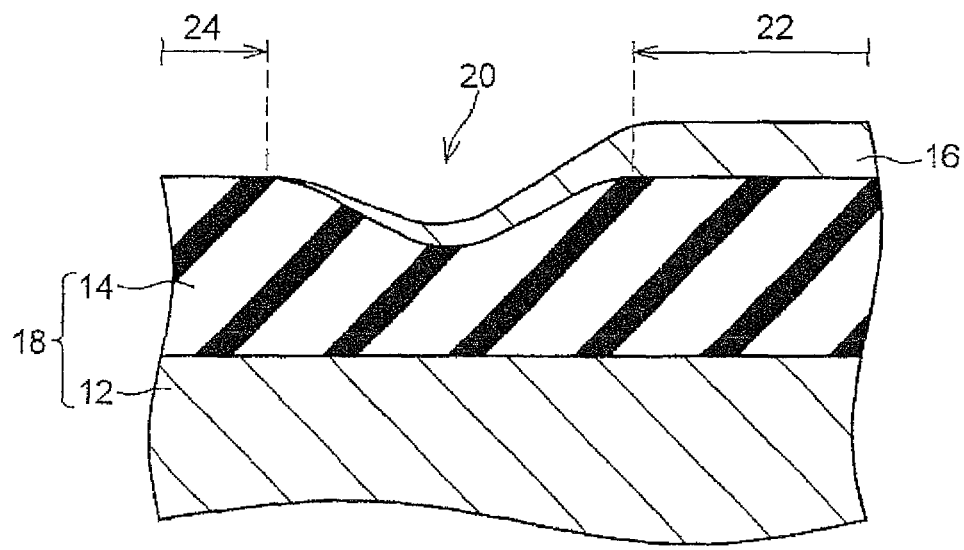
FIG. 3 is an enlarged longitudinal sectional view of the semiconductor device 10 in the vicinity of a groove 20.

As shown in FIG. 3, the groove 20 has a smooth, substantially arc-shaped section in its width direction. In the groove 20, the conductive film 16 is thin on the external region 24 side while it becomes thicker toward the internal region 22 side.

Figure 4:
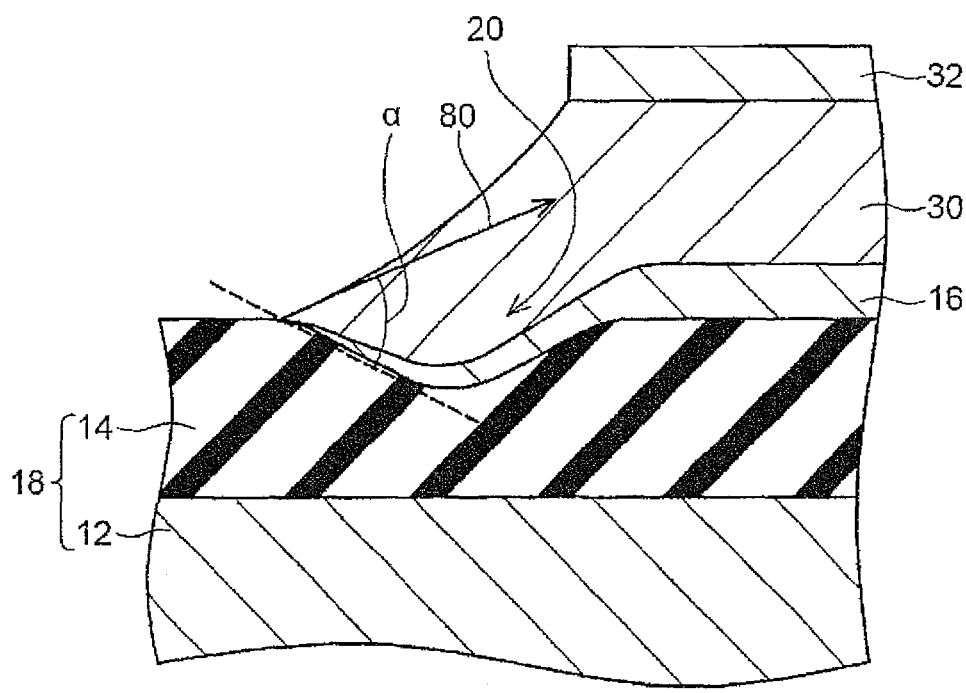
FIG. 4 is an enlarged sectional view of a conductive film 16 in which solder 30 is brazed.
Figure 5:
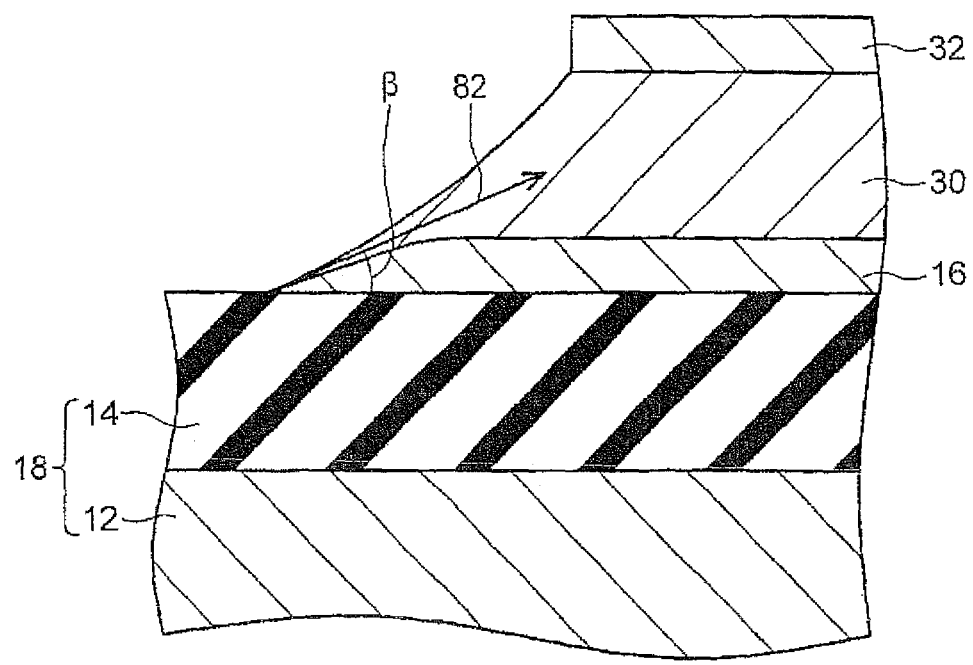
FIG. 5 is an enlarged sectional view of the conductive film 16 in which solder 30 is brazed in the semiconductor device having no groove 20.

As shown in FIG. 4, the conductive film 16 may be brazed to an external terminal 32 with solder 30 (i.e., brazing metal). An arrow 80 in FIG. 4 indicates thermal stress applied from the solder 30 to the end portion of the conductive film 16. Further, a dotted line in FIG. 4 indicates a direction (tangential direction) of the top face of the substrate 18 at the position of the end portion of the conductive film 16. An arrow 82 in FIG. 5 indicates a thermal stress applied to the end portion of the conductive film 16 from the solder 30 in case where no groove 20 is formed in the substrate 18 as a comparative example. In case where no groove 20 exists as shown in FIG. 5, an angle β between a stress 82 and the top face of the substrate 18 is small at the end portion of the conductive film 16. Thus, the conductive film 16 is easy to separate due to the stress 82. Contrary to this, if the groove 20 exists as shown in FIG. 4, an angle α between a stress 80 and the top face of the substrate 18 (i.e., a dotted line) is large at the end portion of the conductive film 16. Thus, even if the stress 80 is generated, the conductive film 16 is hard to separate.

Figure 6:
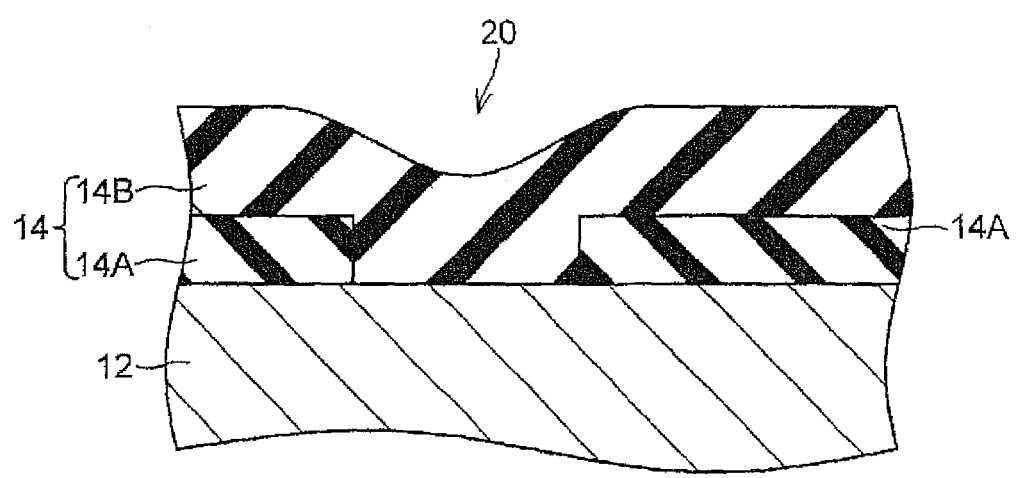
FIG. 6 is an explanatory diagram of step for forming the groove 20.

Next, a manufacturing method of the semiconductor device 10 will be described. First, as shown in FIG. 6, two stepped structures 14A are formed on the semiconductor substrate 12 with an interval therebetween. The stepped structure 14A is formed by providing the interval at a position corresponding to the groove 20. In the meantime, the stepped structure 14A can be formed using various methods, for example, by applying insulation material. Next, an insulation film 14B is formed on the surface of the substrate including the stepped structure 14A. As a result, the insulation film 14 having the groove 20 on its top face is completed. In the meantime, the shape of the groove 20 can be controlled according to the width of the interval of the stepped structures 14A, the height thereof, the shape (tapered, curved or the like) of the end portion of the stepped structure 14A, forming condition of the insulation film 14B and the like.

Alternatively, instead of the above-described formation method of the insulation film 14 and the groove 20, a following method may be also adopted. According to this method, the insulation film 14 is formed on the top face of the semiconductor substrate 12 and after that, the groove 20 is formed by etching the insulation film 14 selectively.

Figure 7:
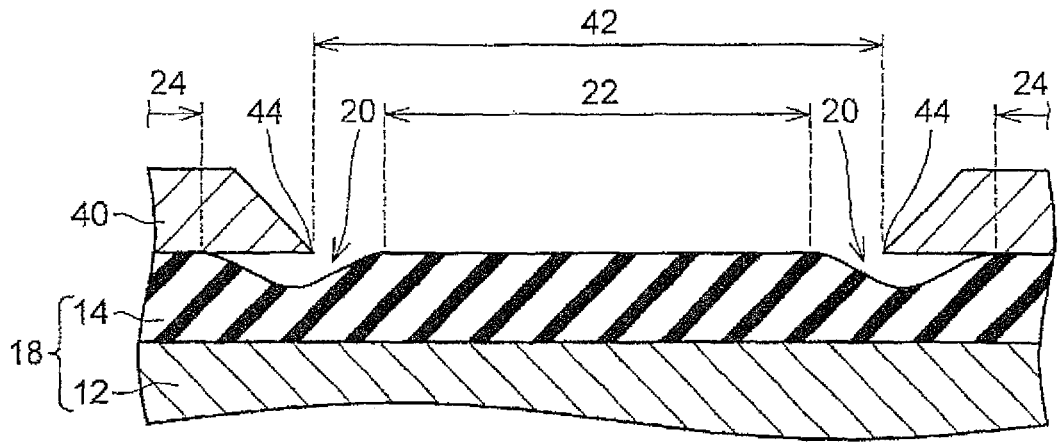
FIG. 7 is an explanatory diagram of step for placing a mask 40.

After the insulation film 14 and the groove 20 are formed, next, the mask 40 is placed on the top face of the substrate 18 as shown in FIG. 7. The mask 40 is a so-called mask plate. That is, the mask 40 is a metal plate. An opening 42 is formed in the mask 40. The end face of the opening 42 has such a tapered shape that the width of the opening 42 decreases toward the lower face thereof. The lower face of the mask 40 excluding the opening 42 is flat. Here, the mask 40 is placed such that the lower face of the mask 40 makes contact with the external region 24 and the opening 42 is, located above the internal region 22. The end portion 44 of the opening 42 is located above the groove 20. The end portion 44 is not in contact with the insulation film 14.

In the meantime, if in FIG. 7, a manufacturing error in width of the opening 42 is expressed with symbol "a" and a placing error of the mask 40 is expressed with symbol "b", the width of the groove 20 is specified to be a+2b or more. Thus, even if the above-mentioned manufacturing error and placing error both become the maximum, the end portion 44 of the opening 42 is always located above the groove 20. In the meantime, if a sufficient process capacity is preserved for mask production and mask installation, it is allowed to set the width of the groove 20 to be $(a^2 +(2b)^2)^{0.5}$ or more.

In the meantime, any foreign matter adheres easily to the end portion 44 of the opening 42 of the mask 40. If the foreign matter gets between the mask 40 and the substrate 18, the mask 40 floats from the substrate 18. As a result, the substrate 18 cannot be masked properly. However, because according to the above-described method, the groove 20 is located below the end portion 44, even if any foreign matter adheres to the end portion 44, the foreign matter hardly can make contact with the substrate 18. Thus, the mask 40 is prevented from floating from the substrate 18.

Figure 8:
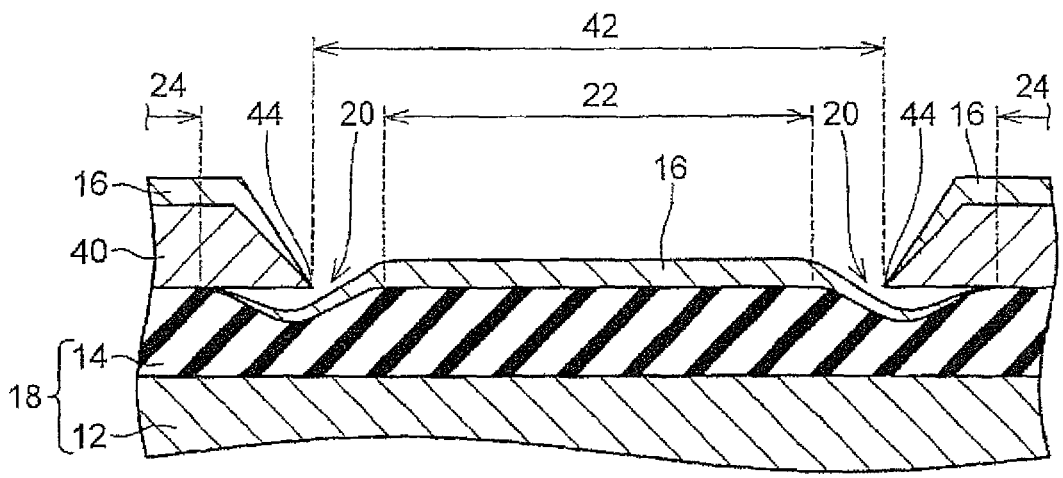
FIG. 8 is an explanatory diagram for growing the conductive film 16.

After the mask 40 is placed on the substrate 18, the deposition process for the conductive film 16 is performed on the substrate 18 by sputtering. As a result, the conductive film 16 is formed in exposed ranges of the substrate 18 and the mask 40 as shown in FIG. 8. Because the internal region 22 exists below the opening 42, the conductive film 16 is formed entirely in the internal region 22. The groove 20 partly exists below the mask 40 and a space is formed between the groove 20 and the mask 40. Because sputtered atoms reach the lower side of the mask 40, the conductive film 16 is also formed inside the groove 20 below the mask 40. Thus, the conductive film 16 is entirely formed inside the groove 20. Because the external region 24 is covered with the mask 40, no conductive film 16 is formed on the insulation film 14 of the external region 24. In the meantime, inside the groove 20, the growth rate of the conductive film 16 decreases toward the outer peripheral side. Thus, as shown in FIG. 3, inside the groove 20, the conductive film 16 becomes thinner toward the outer peripheral side.

After the conductive film 16 is formed, the mask 40 is removed from the substrate 18. Then, the semiconductor device 10 shown in FIG. 1 is completed. In the meantime, when the conductive film 16 is connected to an external electrode, it is permissible to further execute the brazing step shown in FIG. 4.

According to the manufacturing method of the first embodiment, as described above, the mask 40 is placed on the substrate 18 such that the end portion 44 of the opening 42 of the mask 40 is located above the groove 20. Then, the deposition process for the conductive film 16 is performed through the mask 40. With such a structure, a range in which the conductive film 16 is formed is determined by the outer peripheral end of the groove 20 (i.e., border between the groove 20 and the external region 24). The position of the outer peripheral end of the groove 20 is not affected by manufacturing error of the mask 40 or placing error of the mask 40. Further, the groove 20 can be formed at a high precision. Thus, according to the manufacturing method of the first embodiment, the conductive film 16 can be formed at a high precision.

Further, because according to this manufacturing method, the end portion 44 of the mask 40 does not make contact with the substrate 18, generation of flaws in the substrate 18 can be prevented.

In the meantime, in the first embodiment, the groove 20 may be regarded as the concave portion mentioned in the present invention.

Figure 9:
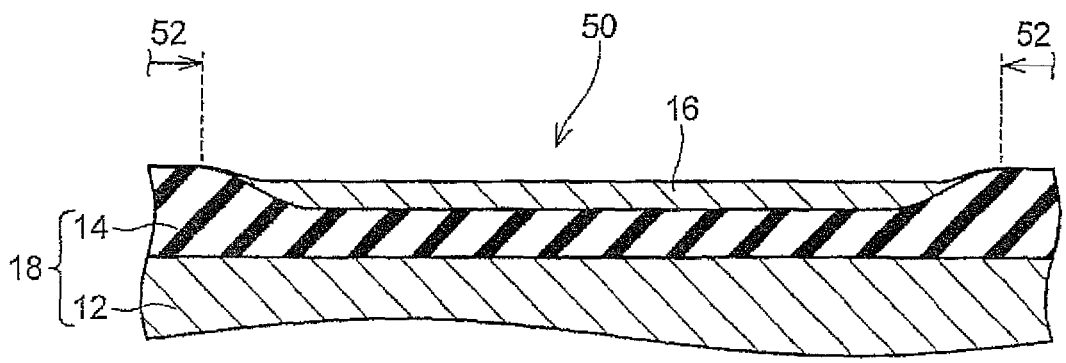
FIG. 9 is a longitudinal sectional view of a semiconductor device 100 according to a second embodiment of the present invention.

As shown in FIG. 9, the semiconductor device 100 of the second embodiment of the present invention also includes the semiconductor substrate 12, the insulation film 14 and the conductive film 16 like the semiconductor device 10 of the first embodiment. However, in the semiconductor device 100 of the second embodiment, a concave portion 50 is formed on the top face of the insulation film 14. Hereinafter, a region outside the concave portion 50 is called external region 52. The bottom face of the concave portion 50 is flat. Further, the external region 52 is flat. The conductive film 16 is formed in the entire range of the concave portion 50. No conductive film 16 is formed within the external region 24. Thus, the outer peripheral end of the conductive film 16 extends along a border (i.e., end portion of the concave portion 50) between the concave portion 50 and the external region 24. In the vicinity of the external region 52, the conductive film 16 is thin in the vicinity of the external region 52 side while it is thicker as it leaves the external region 52. According to the structure of FIG. 9, the conductive film 16 can be prevented from being separated like in FIG. 4.

Next, a manufacturing method of the semiconductor device 100 of the second embodiment will be described. First, the insulation film 14 having the concave portion 50 is formed on the semiconductor substrate 12. The insulation film 14 having the concave portion 50 can be formed according to substantially the same method as the insulation film 14 of the first embodiment.

Figure 10:
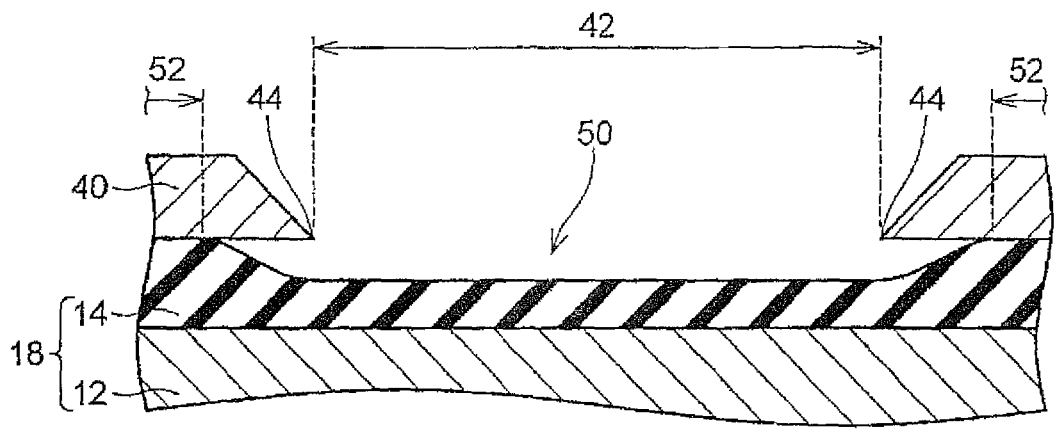
FIG. 10 is an explanatory diagram of step for placing the mask 40.

After the insulation film 14 and the concave portion 50 are formed, next, the mask 40 is placed on the top face of the substrate 18 as shown in FIG. 10. The mask 40 is substantially the same as that used in the first embodiment. Here, the mask 40 is placed such that the lower face of the mask 40 makes contact with the external region 52 and the opening 42 is located above the concave portion 50. The end portion of the opening 42 is located above the concave portion 50. The end portion 44 is not in contact with the insulation film 14.

Figure 11:
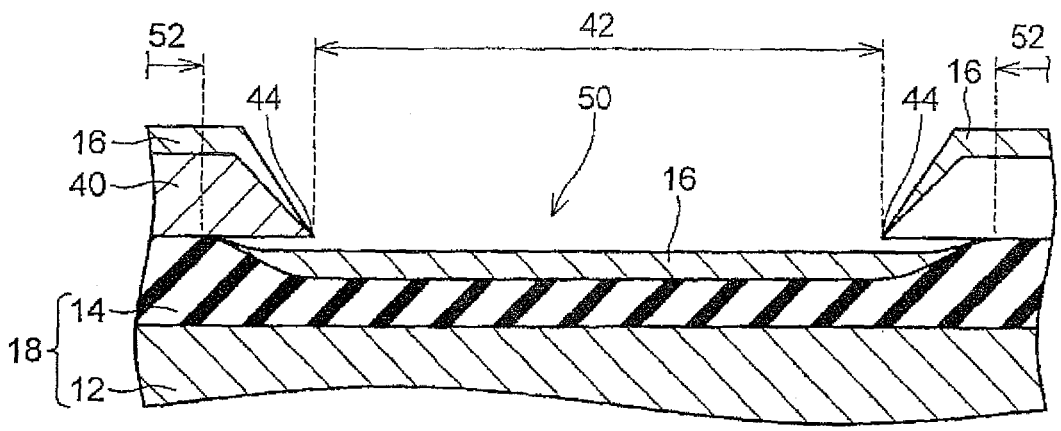
FIG. 11 is an explanatory diagram of step for growing the conductive film 16.

After the mask 40 is placed on the substrate 18, the deposition process for the conductive film 16 is performed on the substrate 18 by sputtering. As a result, the conductive film 16 is formed in exposed ranges of the substrate 18 and the mask 40 as shown in FIG. 11. The concave portion 50 partly exists below the mask 40 and a space is formed between the concave portion 50 and the mask 40. Because sputtered atoms reach the lower side of the mask 40, the conductive film 16 is also formed inside the concave portion 50 below the mask 40. Thus, the conductive film 16 is formed inside the entire range of the concave portion 50. Because the external region 52 is covered with the mask 40, no conductive film 16 is formed on the insulation film 14 of the external region 52.

After the conductive film 16 is formed, the mask 40 is removed from the substrate 18. Then, the semiconductor device 10 shown in FIG. 9 is completed. Even when using the manufacturing method of the second embodiment, it is permissible to further execute brazing step.

According to the manufacturing method of the second embodiment, as described above, the mask 40, is placed on the substrate 18 such that the end portion 44 of the opening 42 of the mask 40 is located above the concave portion 50. Then, the deposition process for the conductive, film 16 is performed through the mask 40. With such a structure, the range in which the conductive film 16 is formed is determined by the outer peripheral end of the concave portion 50 (i.e., border between the concave portion 50 and the external region 24). The position of the outer peripheral end of the concave portion 50 is not affected by manufacturing error of the mask 40 or placing error of the mask 40. Further, the concave portion 50 can be formed at a high precision. Thus, according to the manufacturing method of the second embodiment, the conductive film 16 can be formed at a high precision.

Further, because according to this manufacturing method, the end portion 44 of the mask 40 does not make contact with the substrate 18, generation of flaws in the substrate 18 can be prevented.

In the meantime, in the second embodiment, the concave portion 50 may be regarded as the concave portion mentioned in the present invention.

Figure 12:
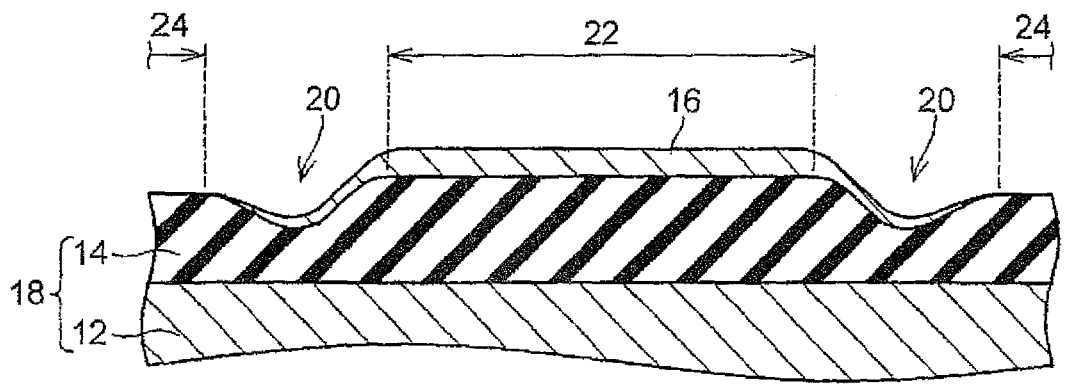
FIG. 12 is a longitudinal sectional view of a semiconductor device according to a first modification of the first embodiment of the present invention.

The structures of the first and second embodiments have been described above. In the meantime, although in the first embodiment, the internal region 22 and the external region 24 are formed substantially on the same plane, the internal region 22 may be located on a higher level than the external region 24 as shown in FIG. 12.

Figure 13:
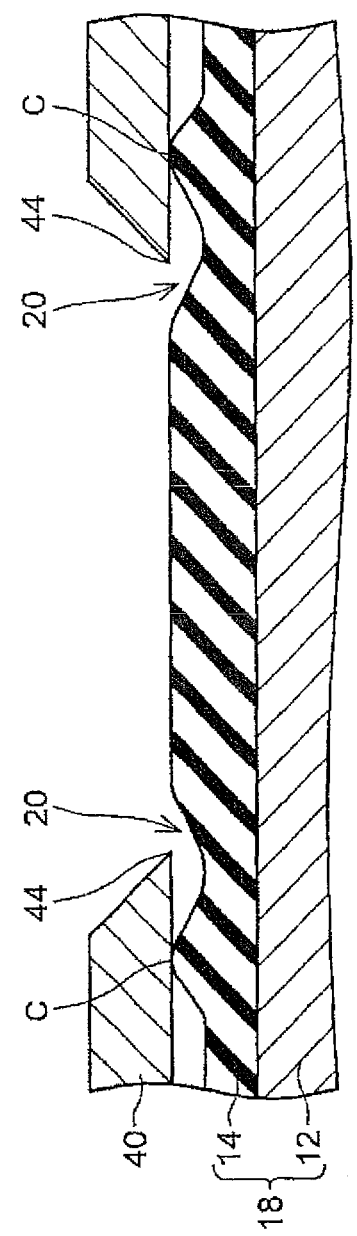
FIG. 13 is a longitudinal sectional view of a semiconductor device according to a second modification of the first embodiment of the present invention.

Further, in the first embodiment, the internal region 22 and the external region 24 are flat. Further, in the second embodiment, the bottom face of the concave portion 50 and the external region 52 are flat. However, they do not always have to be flat. The concave and convex portions may be formed in these regions. For example, as shown in FIG. 13, a region C which makes contact with the mask 40 may have a convex sectional shape. Because even with such a structure, a region in which an electrode is formed is determined by the position of the outer peripheral end (i.e., contact region C) of the groove 20, the same effect as the first embodiment can be obtained. Further, in FIG. 13, the structure of the concave portion 50 may be adopted instead of the groove 20.

Figure 14:
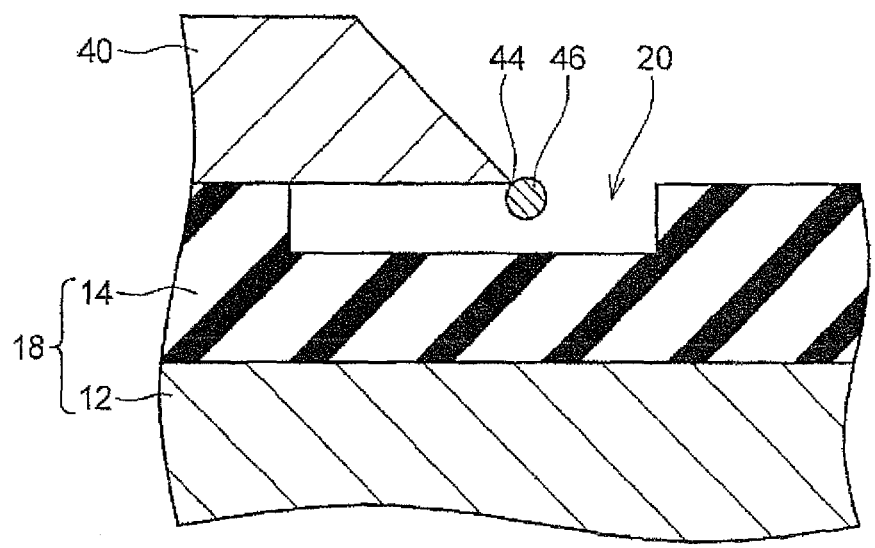
FIG. 14 is a longitudinal sectional view of a semiconductor device according to a third modification of the first embodiment of the present invention.
Figure 15:
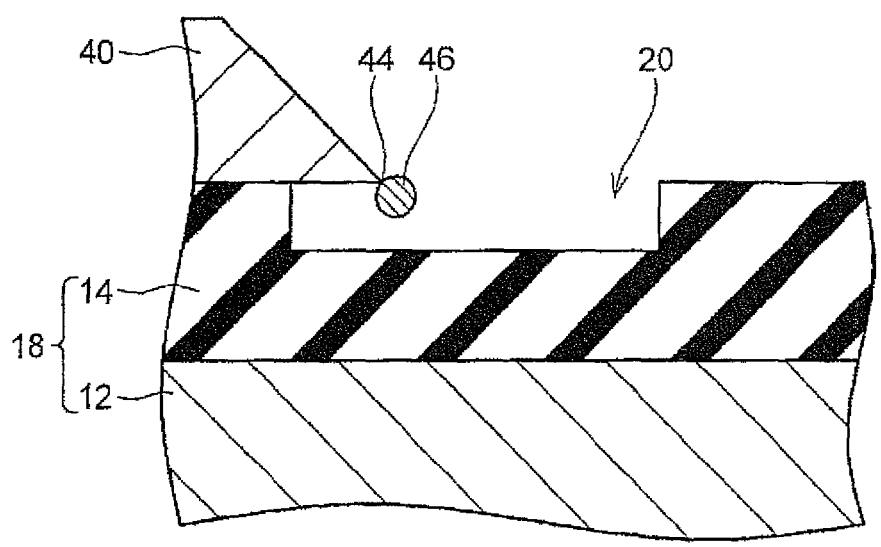
FIG. 15 is a longitudinal sectional view of a semiconductor device according to the third modification of the first embodiment of the present invention.

Further, in the first embodiment, the width-direction sectional shape of the groove 20 is arc-shaped. However, as shown in FIG. 14, the width-direction TO sectional shape of the groove 20 may be rectangular. That is the depth of the groove 20 may be substantially constant. With such a structure, if any foreign matter 46 adheres to the end portion 44 of the opening 42 of the mask 40, the mask 40 can be prevented from floating from the substrate 18 effectively. That is, even if the position of the mask 40 deviates as shown in FIG. 15, d sufficient space is secured below the end portion 44 of the opening 42. Thus, even if the position of the mask 40 deviates, the mask 40 can be prevented from floating from the substrate 18 due to the foreign matter.

Further, in the first and second embodiments, the lower face of the mask 40 is flat. If the lower face of the mask 40 is flat as described above, a contact area between the mask 40 and the substrate 18 increases thereby facilitating heat conduction from the mask 40 to the substrate 18. Thus, upon film deposition process, a temperature rise of the mask 40 is suppressed so that thermal expansion of the mask 40 can be suppressed. However, in the first and second embodiments, the lower face of the mask 40 does not always have to be flat. For example, as shown in FIG. 16, a concave portion 48 may be formed on a part of the lower face of the mask 40. That is, if a contact portion D between the mask 40 and the substrate 18 (i.e., a contact portion D adjacent to the groove 20) is configured not to be affected by any deviation in position of the mask 40, the conductive film 16 can be formed at a high precision. In the meantime, if the lower face of the mask 40 at the contact portion D is flat as shown in FIG. 16, an influence of the deviation in position of the mask 40 can be prevented. Thus, the lower face of the mask 40 is preferred to be flat at least in the vicinity of the end portion 44 of the opening 42. Further, in FIG. 16, the structure of the concave portion 50 may be adopted instead of the groove 20.

Although in the first and second embodiments, the conductive film 16 is formed on the top face of the insulation film 14, even if conductive film is formed on the top face of other layer, such as the semiconductor layer, the arts mentioned in the first and second embodiments can be used.

Further, although in the above-described first and second embodiments, sputtering is used as the deposition process for the conductive film, various film deposition processes such as deposition, plating, application of conductive paste (spray, ink jet or other application method) and the like may be used, instead of sputtering. Even these film deposition processes can grow conductive film inside the groove 20 or the concave portion 50 below the mask 40. Thus, like the above-described embodiments, conductive film can be formed at a high precision.

Although the specific examples of the present invention have been described in detail above, they are just exemplifications. The embodiments exemplified above may be modified, altered or combined in various ways. The technical components described in this specification or drawings exert their technical utilities independently or by various combinations.

What is claimed is:

1. A manufacturing method of a semiconductor device, comprising:
    placing a mask having an opening on an external region of a top face of a substrate to locate an end portion of the opening of the mask just above a concave portion formed on the top face of the substrate, the external region being located outside the concave portion;
    growing a conductive film on part of the top face of the substrate through the mask after the mask is placed on the substrate, the part of the top face containing the concave portion; and
    removing the mask from the substrate after the conductive film is grown,
    wherein the concave portion is a groove continuously surrounding an internal region of the top face of the substrate, the internal region being located inside the concave portion, and
    a width of the groove is equal to or more than a sum of a manufacturing error of an opening width of the mask in a width direction of the groove and two times a placing position error of the mask in the width direction of the groove.

2. A manufacturing method of a semiconductor device, comprising;
    placing a mask having an opening on an external region of a top face of a substrate to locate an end portion of the opening of the mask just above a concave portion formed on the top face of the substrate, the external region being located outside the concave portion;

growing a conductive film on part of the top face of the substrate through the mask after the mask is placed on the substrate, the part of the top face containing the concave portion;

removing the mask from the substrate after the conductive film is grown, and forming the concave portion by forming an insulation film on surfaces of stepped structures which are formed with an interval between the stepped structures.

3. A manufacturing method of a semiconductor device, comprising:

placing a mask having an opening on an external region of a top face of a substrate to locate an end portion of the opening of the mask just above a concave portion formed on the top face of the substrate, the external region being located outside the concave portion;

growing a conductive film on part of the top face of the substrate through the mask after the mask is placed on the substrate, the part of the top face containing the concave portion; and removing the mask from the substrate after the conductive film is grown, wherein the concave portion is a groove continuously surrounding an internal region of the top face of the substrate, the internal region being located inside the concave portion, and a width of the groove is equal to or more than a sum of a manufacturing error of an opening width of the mask in a width direction of the groove and two times a placing position error of the mask in the width direction of the groove.

4. A manufacturing method of a semiconductor device, comprising:

forming a concave portion on a top surface of a substrate by forming an insulation film on surfaces of stepped structures which are formed with an interval between the stepped structures, placing a mask having an opening on an external region of the top face of the substrate to locate an end portion of the opening of the mask just above the concave portion formed on the top face of the substrate, the external region being located outside the concave portion;

growing a conductive film on part of the top face of the substrate through the mask after the mask is placed on the substrate, the part of the top face containing the concave portion; and removing the mask from the substrate after the conductive film is grown.

* * * * *